United States Patent
Choi

(10) Patent No.: US 12,419,078 B2
(45) Date of Patent: Sep. 16, 2025

(54) LIGHT EMITTING DISPLAY DEVICE AND METHOD OF MANUFACTURING THE SAME

(71) Applicant: SILICON WORKS CO., LTD., Daejeon (KR)

(72) Inventor: Kee Joon Choi, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 17/363,994

(22) Filed: Jun. 30, 2021

(65) Prior Publication Data
US 2022/0005897 A1    Jan. 6, 2022

(30) Foreign Application Priority Data
Jul. 6, 2020 (KR) .................. 10-2020-0082810

(51) Int. Cl.
| | | |
|---|---|---|
| H01L 27/32 | (2006.01) | |
| H10D 30/67 | (2025.01) | |
| H10K 50/856 | (2023.01) | |
| H10K 59/122 | (2023.01) | |
| H10K 59/127 | (2023.01) | |
| H10K 59/80 | (2023.01) | |
| H10K 71/00 | (2023.01) | |
| H10K 59/12 | (2023.01) | |
| H10K 59/131 | (2023.01) | |

(52) U.S. Cl.
CPC ....... *H10D 30/6704* (2025.01); *H10K 50/856* (2023.02); *H10K 59/122* (2023.02); *H10K 59/1275* (2023.02); *H10K 59/878* (2023.02); *H10K 71/00* (2023.02); *H10K 59/1201* (2023.02); *H10K 59/131* (2023.02)

(58) Field of Classification Search
CPC .. H10K 59/1275; H10K 59/122; H10K 71/00; H10K 50/856; H10K 59/1201
USPC .......................................................... 257/40
See application file for complete search history.

(56) References Cited

U.S. PATENT DOCUMENTS

2006/0273308 A1*  12/2006  Wang .................. H10K 59/1275
                                                                257/40
2014/0239457 A1*   8/2014  Daubenspeck ......... H01L 23/34
                                                                257/621
(Continued)

FOREIGN PATENT DOCUMENTS

| CN | 110518055 A | 11/2019 |
|---|---|---|
| CN | 111063706 A | 4/2020 |

(Continued)

*Primary Examiner* — Dzung Tran
(74) *Attorney, Agent, or Firm* — ROTHWELL, FIGG, ERNST & MANBECK, P.C.

(57) ABSTRACT

The present disclosure provides a light-emitting display device including a first substrate and a second substrate, a first circuit layer provided on one surface of the first substrate, a second circuit layer provided on one surface of the second substrate facing the first substrate, a first pad layer provided on one surface of the first circuit layer, a second pad layer provided on one surface of the second circuit layer and electrically connected to the first pad layer, and a light-emitting element layer provided on the other surface of the second substrate that does not face the first substrate, and a method of manufacturing the same.

16 Claims, 18 Drawing Sheets

(56) References Cited

U.S. PATENT DOCUMENTS

| | | | | |
|---|---|---|---|---|
| 2014/0312334 | A1* | 10/2014 | Yamazaki | H05B 33/04 |
| | | | | 257/40 |
| 2016/0118423 | A1* | 4/2016 | Yamazaki | H01L 27/14609 |
| | | | | 257/43 |
| 2017/0288093 | A1* | 10/2017 | Cha | H01L 33/58 |
| 2018/0097047 | A1* | 4/2018 | Jung | H10K 59/122 |
| 2018/0097074 | A1* | 4/2018 | Meiser | H01L 29/7825 |
| 2018/0331325 | A1* | 11/2018 | Zhang | H10K 71/00 |
| 2020/0203452 | A1* | 6/2020 | Kang | H01L 23/538 |
| 2021/0335942 | A1* | 10/2021 | Wang | H10K 59/122 |
| 2021/0335943 | A1* | 10/2021 | Song | H10K 50/8428 |

FOREIGN PATENT DOCUMENTS

| | | |
|---|---|---|
| KR | 10-0747418 B1 | 8/2007 |
| KR | 10-2020-0079389 A | 7/2020 |
| TW | 201715231 A | 5/2017 |

* cited by examiner

LIGHT EMITTING DISPLAY DEVICE AND METHOD OF MANUFACTURING THE SAME

CROSS-REFERENCE TO RELATED APPLICATIONS

This application claims the benefit of the Korean Patent Applications No. 10-2020-0082810 filed on Jul. 6, 2020, which are hereby incorporated by reference as if fully set forth herein.

FIELD

The present disclosure relates to a light-emitting display device and a method of manufacturing the same.

BACKGROUND

A light-emitting display device includes a light-emitting element, in which a light-emitting layer is formed between an anode and a cathode, and is a device displaying an image by causing the light-emitting layer to emit light by an electric field between the two electrodes.

In order to emit light from the light-emitting layer, a pixel circuit should be provided in a display region, and a driving circuit should be provided in a non-display region outside the display region in order to apply various signals to the pixel circuit.

Since such a conventional light-emitting display device should include the pixel circuit and the driving circuit, there is a limit in expanding a light-emitting region.

SUMMARY

The present disclosure is designed to solve the above-described conventional problems, and the present disclosure is directed to providing a light-emitting display device capable of expanding a light-emitting region and a method of manufacturing the same.

According to an aspect of the present disclosure, there is provided a light-emitting display device including a first substrate and a second substrate, a first circuit layer provided on one surface of the first substrate, a second circuit layer provided on one surface of the second substrate facing the first substrate, a first pad layer provided on one surface of the first circuit layer, a second pad layer provided on one surface of the second circuit layer and electrically connected to the first pad layer, and a light-emitting element layer provided on the other surface of the second substrate that does not face the first substrate.

According to another aspect of the present disclosure, there is provided a method of manufacturing a light-emitting display device including forming a first circuit layer on one surface of a first substrate and forming a first pad layer on one surface of the first circuit layer, forming a second circuit layer on one surface of a second substrate and forming a second pad layer on one surface of the second circuit layer, aligning the first substrate and the second substrate so that the first pad layer and the second pad layer face each other and then electrically connecting the first pad layer and the second pad layer, and forming a light-emitting element layer on the other surface of the second substrate that does not face the first substrate.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
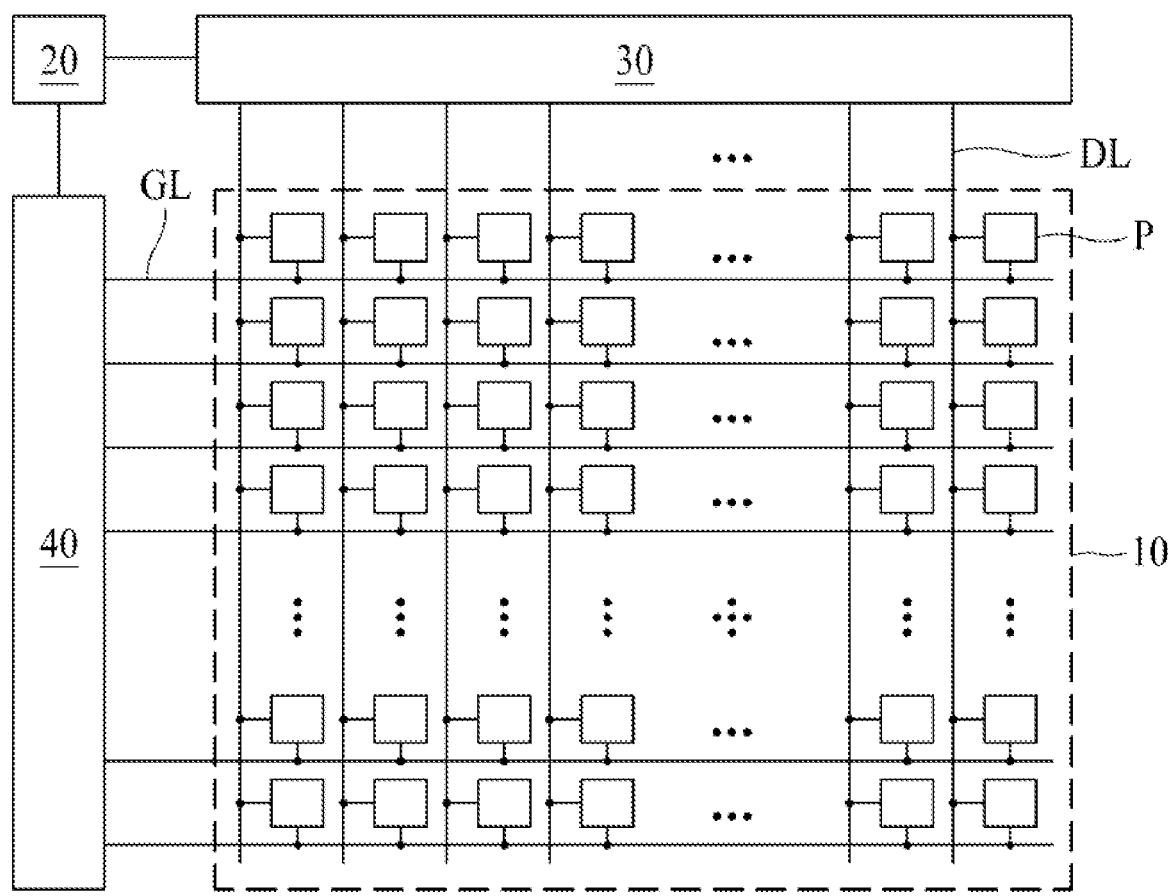
FIG. 1 is a schematic configuration diagram of a light-emitting display device according to an embodiment of the present disclosure.

Advantages and features of the present disclosure and methods for achieving them will be apparent with reference to the embodiments described below in detail with reference to the accompanying drawings. However, the present disclosure is not limited to the embodiments disclosed below but will be implemented in various forms, and only the embodiments of the present disclosure make the disclosure of the present disclosure complete and are provided to fully convey the scope of the present disclosure to those skilled in the art to which the present disclosure belongs, and the present disclosure is defined only by the scope of the claims.

The shapes, sizes, ratios, angles, numbers, etc. disclosed in the drawings for describing the embodiments of the present disclosure are exemplary, and thus the present disclosure is not limited to the illustrated matters. The same reference numerals refer to the same components throughout the specification. In addition, in the description of the present disclosure, when it is determined that a detailed description of a well-known related technology may unnecessarily obscure the gist of the present disclosure, the detailed description thereof will be omitted. When "include," "have," and "consist of" mentioned in the present specification are used, other parts may be added unless "only" is used. The case of expressing the components in the singular includes the case of including the plural expressions unless otherwise specified.

In interpreting the component, the description is to be construed as including the error range even though there is no other explicit description.

In the case of a description of the positional relationship, for example, when the positional relationship of two parts is described as "on," "above," "below," "next to," etc., one or more other parts may be located between the two parts as long as "immediately" or "directly" is not used.

In the case of a description of the temporal relationship, for example, when the temporal precedence relationship is described using "after," "following," "next," "before," etc., the case that is not continuous may also be included as long as "immediately" or "directly" is not used.

The terms "first," "second," etc., are used to describe various elements, but these elements are not limited by these terms. These terms are only used to distinguish one element from another element. Therefore, a first element mentioned below may be a second element within the technological scope of the present disclosure.

Each of the features of the various embodiments of the present disclosure may be partially or wholly coupled to or combined with each other, various interlocking and driving are technically possible, and each of the embodiments may be independently performed with respect to each other or may be performed together in an associational relationship.

Hereinafter, preferred embodiments of the present disclosure will be described in detail with reference to the accompanying drawings.

FIG. 1 is a schematic configuration diagram of a light-emitting display device according to an embodiment of the present disclosure.

As can be seen in FIG. 1, the light-emitting display device according to an embodiment of the present disclosure includes a pixel unit 10 and driving units 20, 30, and 40.

The pixel unit 10 includes a plurality of gate lines GL, a plurality of data lines DL, and a plurality of pixels P that are provided on a substrate. The plurality of gate lines GL and the plurality of data lines DL are arranged to cross each other to define a plurality of pixel regions, and the plurality of pixels P are provided in the plurality of pixel regions.

Each of the plurality of pixels P displays an image according to a gate signal supplied from an adjacent gate line GL and a data signal supplied from an adjacent data line DL. Each of the plurality of pixels P may be defined as a region of a minimum unit in which light is emitted and may be expressed as a sub-pixel. Therefore, a combination of the plurality of pixels P adjacent to each other may form one unit pixel for displaying a color. For example, one unit pixel may be formed by a combination of three pixels P of red, green, and blue that are arranged adjacent to each other, but the present disclosure is not necessarily limited thereto.

Each of the plurality of pixels P includes a pixel circuit and a light-emitting element connected to the pixel circuit, which will be described later with reference to FIG. 2.

The driving units 20, 30, and 40 include a control circuit 20, a data driving circuit 30, and a gate driving circuit 40.

The control circuit 20 may generate pixel data for each pixel corresponding to each of the plurality of pixels P based on an image signal to supply the generated pixel data to the data driving circuit 30. In addition, the control circuit 20 generates a data control signal based on a timing synchronization signal to provide the data control signal to the data driving circuit 30. In addition, the control circuit 20 generates a gate control signal based on the timing synchronization signal to provide the gate control signal to the gate driving circuit 40.

The data driving circuit 30 is connected to the plurality of data lines DL provided in the pixel unit 10. The data driving circuit 30 receives the pixel data and the data control signal for each pixel provided from the control circuit 20 and receives a plurality of reference gamma voltages provided from a power supply circuit. The power supply circuit may be included in the driving units 20, 30, and 40 as a separate component. The data driving circuit 30 converts the pixel data for each pixel into a data signal for each pixel using the data control signal and the plurality of reference gamma voltages, and supplies the converted data signal for each pixel to a corresponding data line DL.

The gate driving circuit 40 is connected to the plurality of gate lines GL provided in the pixel unit 10. The gate driving circuit 40 generates a gate signal according to a predetermined order based on the gate control signal supplied from the control circuit 20 to supply the gate signal to a corresponding gate line GL.

Figure 2:
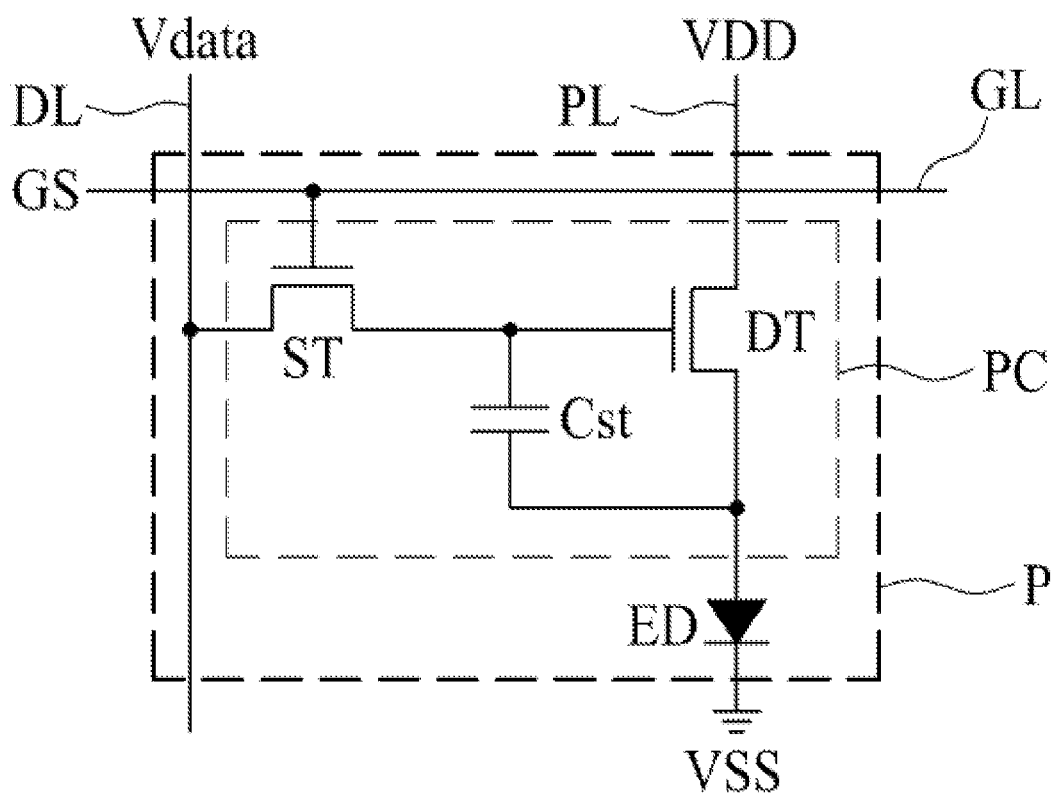
FIG. 2 is an equivalent circuit diagram of a pixel in the light-emitting display device according to an embodiment of the present disclosure.

FIG. 2 is an equivalent circuit diagram of a pixel in the light-emitting display device according to an embodiment of the present disclosure.

As can be seen from FIG. 2, the pixel of the light-emitting display device according to an embodiment of the present disclosure includes a pixel circuit PC and a light-emitting element ED.

The pixel circuit PC is provided in a pixel region defined by the gate line GL and the data line DL and is connected to an adjacent gate line GL, data line DL, and power supply line PL. The pixel circuit PC controls light emission of the light-emitting element ED according to a data signal Vdata from the data line DL in response to a gate-on signal GS from the gate line GL and may include at least two thin film transistors and at least one capacitor. The pixel circuit PC according to an embodiment includes a switching thin film transistor ST, a driving thin film transistor DT, and a capacitor Cst.

The switching thin film transistor ST may include a gate electrode connected to the gate line GL, a source or drain electrode connected to the data line DL, and a drain or source electrode connected to a gate electrode of the driving thin film transistor DT. The switching thin film transistor ST is turned on according to the gate-on signal GS supplied to the gate line GL and supplies the data signal Vdata supplied to the data line DL to the gate electrode of the driving thin film transistor DT.

The driving thin film transistor DT includes the gate electrode connected to the drain or source electrode of the switching thin film transistor ST, a drain or source electrode connected to a first driving power supply VDD through the power supply line PL, and a source or drain electrode connected to the light-emitting element ED. The driving thin film transistor DT is turned on according to a gate-source voltage based on the data signal Vdata supplied from the switching thin film transistor ST to control a current supplied from the first driving power supply VDD to the light-emitting element ED.

The capacitor Cst is connected between the gate electrode and the source electrode of the driving thin film transistor DT or between the gate electrode and the drain electrode of the driving thin film transistor DT to store a voltage corresponding to the data signal Vdata supplied to the gate electrode of the driving thin film transistor DT, and the driving thin film transistor DT is turned on by the stored voltage. In this case, the capacitor Cst may maintain a state in which the driving thin film transistor DT is turned on until a new data signal Vdata is supplied via the switching thin film transistor ST in the next frame.

The light-emitting element ED is provided in a light-emitting region in the pixel region and emits light according to a current supplied from the pixel circuit PC. The light-emitting element ED includes a first electrode connected to the source or drain electrode of the driving thin film transistor DT, a second electrode connected to a second driving power supply VSS, and a light-emitting layer provided between the first electrode and the second electrode. Here, the light-emitting layer may include at least one of an organic light-emitting layer, an inorganic light-emitting layer, and a quantum dot light-emitting layer.

Figure 3:
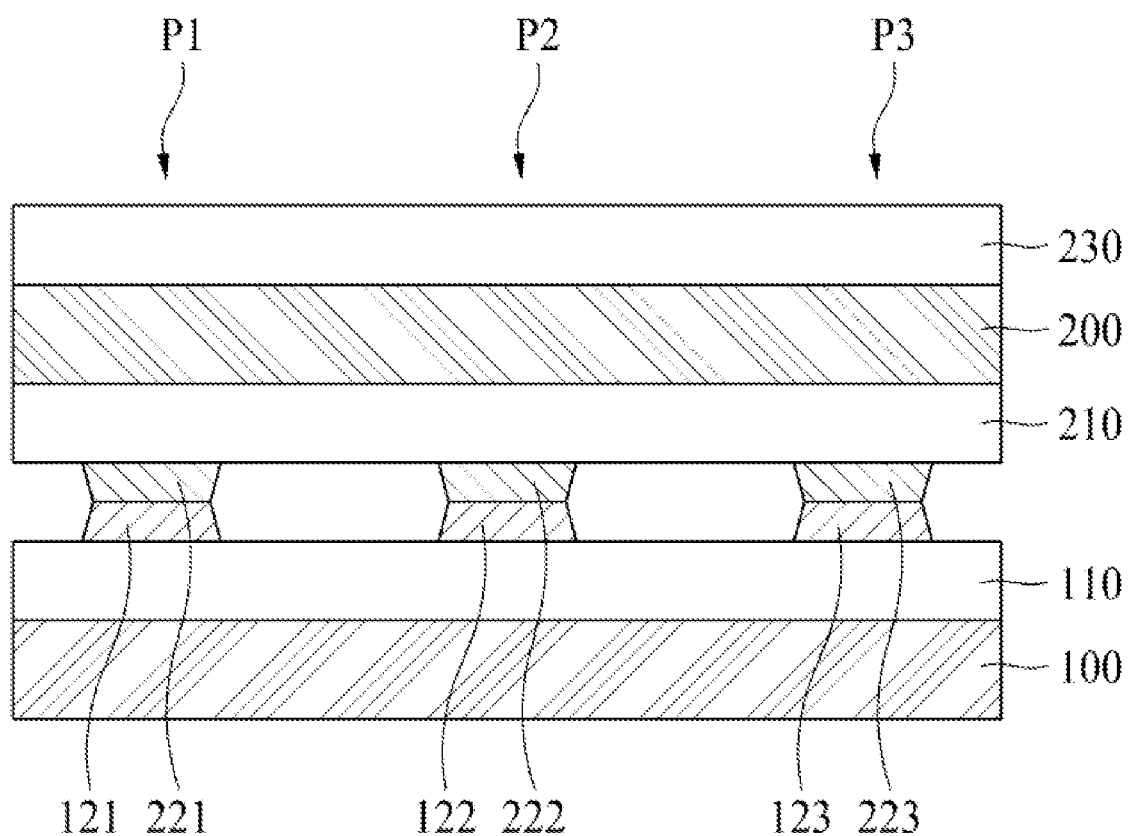
FIG. 3 is a schematic cross-sectional view of the light-emitting display device according to an embodiment of the present disclosure.

FIG. 3 is a schematic cross-sectional view of the light-emitting display device according to an embodiment of the present disclosure.

As can be seen from FIG. 3, the light-emitting display device according to an embodiment of the present disclosure includes a first substrate 100, a first circuit layer 110, first pad layers 121, 122, and 123, a second substrate 200, a second circuit layer 210, second pad layers 221, 222, and 223, and a light-emitting element layer 230.

The first substrate 100 constitutes a lower substrate of the light-emitting display device and may be made of a semiconductor substrate such as silicon.

The first circuit layer 110 is formed on one surface of the first substrate 100. Specifically, the first circuit layer 110 is formed on an upper surface of the first substrate 100 facing the second substrate 200. The driving units 20, 30, and 40 of FIG. 1 described above may be formed on the first circuit layer 110. Specifically, at least one circuit of the control circuit 20, the data driving circuit 30, the gate driving circuit 40, and the power supply circuit may be formed on the first circuit layer 110. When the first substrate 100 is made of the semiconductor substrate such as silicon, a part of circuits constituting the driving units 20, 30, and 40 may be formed inside the first substrate 100, and the remaining part of the circuits constituting the driving units 20, 30, and 40 may be formed in the first circuit layer 110. For example, the circuits constituting the driving units 20, 30, and 40 may be formed of various thin film transistors and various lines, and the various thin film transistors may be formed inside the first substrate 100, and the various lines may be formed on the first circuit layer 110.

The first pad layers 121, 122, and 123 are formed on one surface of the first circuit layer 110, specifically on an upper surface of the first circuit layer 110 facing the second substrate 200. The first pad layers 121, 122, and 123 include a first pad 121 provided in a first pixel P1, a first pad 122 provided in a second pixel P2, and a first pad 123 provided in a third pixel P3. The first pad layers 121, 122, and 123 may be connected to the data driving circuit 30 of the first circuit layer 110, may be connected to the gate driving circuit 40 of the first circuit layer 110, or may be connected to the power supply circuit of the first circuit layer 110.

The second substrate 200 constitutes an upper substrate of the light-emitting display device and may include a conductive material. For example, the second substrate 200 may include a semiconductor material such as silicon. The second substrate 200 includes the conductive material so that the second circuit layer 210 formed on one surface of the second substrate 200 and the light-emitting element layer 230 formed on the other surface of the second substrate 200 may be electrically connected to each other.

The second circuit layer 210 is formed on one surface of the second substrate 200, specifically, on a lower surface of the second substrate 200 facing the first substrate 100. The pixel circuit PC of FIG. 2 described above may be formed in the second circuit layer 210 for each of the pixels P1, P2, and P3. That is, a gate line GL, a data line DL, a power supply line PL, a switching thin film transistor ST, a driving thin film transistor DT, and a capacitor Cst are formed in the second circuit layer 210.

When the second substrate 200 is made of the semiconductor substrate such as silicon, a part of circuits constituting the pixel circuit PC may be formed inside the second substrate 200, and the remaining part of the circuits constituting the pixel circuit PC may be formed in the second circuit layer 210. For example, a part of the thin film transistor such as the switching thin film transistor ST and the driving thin film transistor DT is formed inside the second substrate 200, and lines such as the gate line GL, the data line DL, and the power supply line PL together with the remaining part of the thin film transistor may be formed in the second circuit layer 210.

The second pad layers 221, 222, and 223 are formed on one surface of the second circuit layer 210, specifically, on a lower surface of the second circuit layer 210 facing the first substrate 100. The second pad layers 221, 222 and 223 include a second pad 221 provided in the first pixel P1, a second pad 222 provided in the second pixel P2, and a second pad 223 provided in the third pixel P3. The second pad layers 221, 222, and 223 may be connected to the gate line GL of the second circuit layer 210, may be connected to the data line DL of the second circuit layer 210, and may be connected to the power supply line PL of the second circuit layer 210.

The second pad layers 221, 222 and 223 are electrically connected to the first pad layers 121, 122, and 123, respectively. When the second pad layers 221, 222, and 223 are connected to the gate line GL of the second circuit layer 210, the first pad layers 121, 122, and 123 are connected to the gate driving circuit 40 of the first circuit layer 110, and accordingly, a gate signal generated from the gate driving circuit 40 of the first circuit layer 110 may be supplied to the gate line GL of the second circuit layer 210 through the first pad layers 121, 122, and 123 and the second pad layers 221, 222, and 223. In addition, when the second pad layers 221, 222, and 223 are connected to the data line DL of the second circuit layer 210, the first pad layers 121, 122, and 123 are connected to the data driving circuit 30 of the first circuit layer 110, and accordingly, a data signal generated from the data driving circuit 30 of the first circuit layer 110 may be supplied to the data line DL of the second circuit layer 210 through the first pad layers 121, 122, and 123 and the second pad layers 221, 222, and 223. In addition, when the second pad layers 221, 222, and 223 are connected to the power supply line PL of the second circuit layer 210, the first pad layers 121, 122, and 123 are connected to the power supply circuit of the first circuit layer 110, and accordingly, power generated from the power supply circuit of the first circuit layer 110 may be supplied to the power supply line PL of the second circuit layer 210 through the first pad layers 121, 122, and 123 and the second pad layers 221, 222, and 223.

Lower surfaces of the second pad layers 221, 222, and 223 may be in direct contact with upper surfaces of the first pad layers 121, 122, and 123, respectively, but the present disclosure is not limited thereto. For example, insulating layers may be additionally formed between the second pad layers 221, 222, and 223 and the first pad layers 121, 122, and 123, and the second pad layers 221, 222, and 223 and the first pad layers 121, 122, and 123 may be electrically connected through separate connection electrodes passing through the insulating layers.

The electrical connection between the second pad layers 221, 222, and 223 and the first pad layers 121, 122, and 123 is made for each of the pixels P1, P2, and P3. That is, the first pad 121 and the second pad 221 provided in the first pixel P1 are electrically connected to each other, the first pad 122 and the second pad 222 provided in the second pixel P2 are electrically connected to each other, and the first pad 123 and the second pad 223 provided in the third pixel P3 are electrically connected to each other.

The light-emitting element layer 230 is formed on the other surface of the second substrate 200, specifically on an upper surface of the second substrate 200 that does not face the first substrate 100.

A part of the light-emitting element ED of FIG. 2 described above may be formed in the light-emitting element layer 230, and the remaining part of the light-emitting element ED may be formed in the second substrate 200. Specifically, the first electrode of the light-emitting element ED connected to the source or drain electrode of the driving thin film transistor DT is formed in the second substrate 200, and the light-emitting layer and the second electrode may be formed in the light-emitting element layer 230. In this case, the first electrode may be made of a semiconductor material.

As described above, according to an embodiment of the present disclosure, the first circuit layer 110 provided with the driving units 20, 30, and 40 is formed on one surface of the first substrate 100, the second circuit layer 210 provided with the pixel circuit PC is formed on one surface of the second substrate 200 facing the first substrate 100, and the light-emitting element layer 230 is formed on the other surface of the second substrate 200 that does not face the first substrate 100 so that the light-emitting region of the light-emitting element layer 230 may be enlarged.

Figure 4:
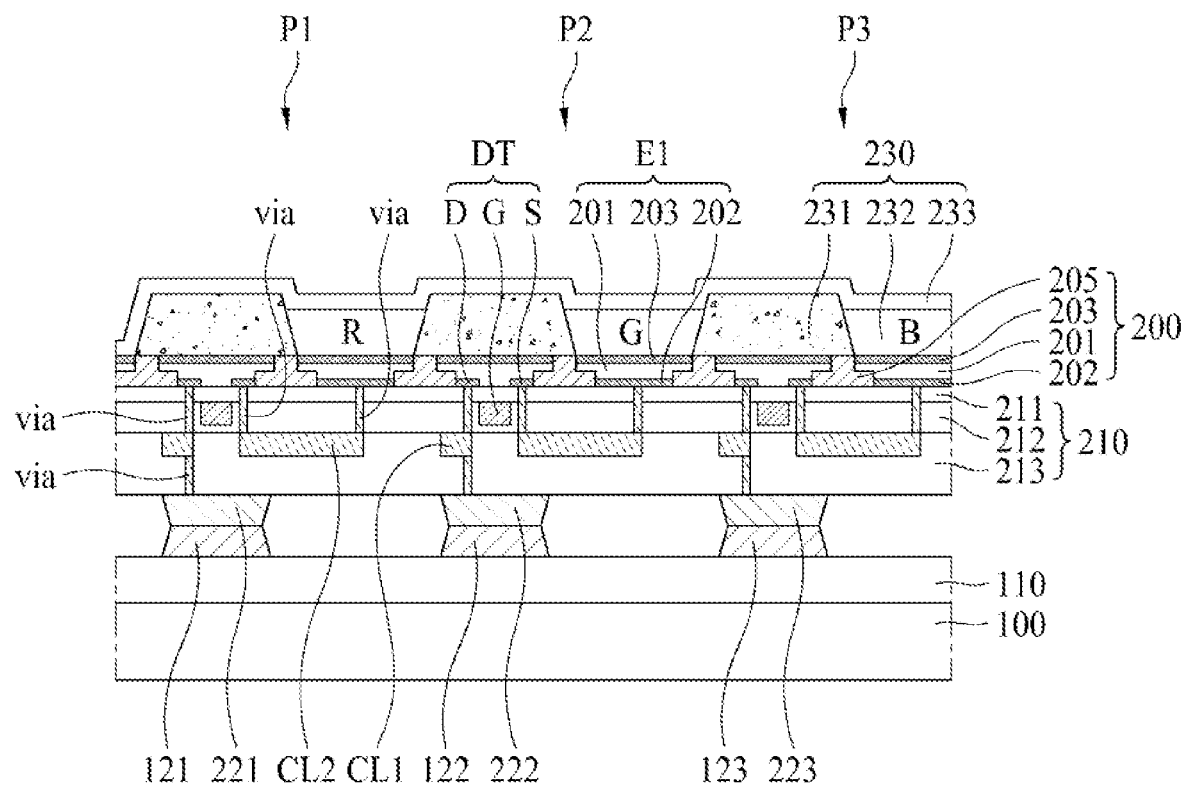
FIG. 4 is a cross-sectional view of a light-emitting display device according to another embodiment of the present disclosure.

FIG. 4 is a cross-sectional view of a light-emitting display device according to another embodiment of the present disclosure.

As can be seen from FIG. 4, the light-emitting display device according to another embodiment of the present disclosure includes a first substrate 100, a first circuit layer 110, first pad layers 121, 122, and 123, a second substrate 200, a second circuit layer 210, second pad layers 221, 222, and 223, and a light-emitting element layer 230.

Since the first substrate 100, the first circuit layer 110, and the first pad layers 121, 122, and 123 are the same as those in FIG. 3 described above, repeated description will be omitted.

The second substrate 200 includes a semiconductor material such as silicon. Specifically, the second substrate 200 includes a base layer 201 made of the semiconductor material, a first doping layer 202 formed on one surface of the base layer 201, specifically a lower surface, and a second doping layer 203 formed on the other surface of the base layer 201, specifically an upper surface. For example, when the base layer 201 is made of a P-type semiconductor material, the first doping layer 202 and the second doping layer 203 may be made of a P+ type semiconductor material doped with a trivalent dopant having the same polarity as the base layer 201.

According to an embodiment of the present disclosure, a first electrode E1 that may be used as an anode of the light-emitting element ED may be formed by a combination of the base layer 201, the first doping layer 202, and the second doping layer 203. A work function of a highly doped semiconductor material such as P+ type silicon is greater than 5 eV. In contrast, a work function of indium tin oxide (ITO) used as a conventional anode of the light-emitting element ED is about 4.7 eV, and a work function of Al is about 4.3 eV. Therefore, according to an embodiment of the present disclosure, luminous efficiency may be improved by using a semiconductor material having a high work function as the first electrode E1 of the light-emitting element ED.

The first electrode E1 of the light-emitting element ED, which is formed of a combination of the base layer 201, the first doping layer 202, and the second doping layer 203, is individually provided for each of the pixels P1, P2, and P3, and in particular, the first electrode E1 is spaced apart for each of the pixels P1, P2, and P3 by a trench 205. That is, the trench 205 is provided in the second substrate 200, and an insulating material is provided in the trench 205 so that the first electrodes E1 of the light-emitting element ED are insulated from each other for each of the pixels P1, P2, and P3 by the insulating material in the trench 205. In this case, the trench 205 may be formed in a structure in which widths of a lower portion and an upper portion are different from each other, and specifically, the width of the lower portion of the trench 205 may be formed larger than the width of the upper portion of the trench 205. In particular, the width of the lower portion of the trench 205 may be the same as a distance between the second doping layer 203 and the source electrode S or a distance between the second doping layer 203 and the drain electrode D.

A thin film transistor, for example, a driving thin film transistor DT, may be provided in a boundary region between the plurality of pixels P1, P2, and P3. Specifically, a source electrode S and a drain electrode D of the driving thin film transistor DT may be formed between the first doping layer 202 in one of the pixels P1, P2, and P3 and the first doping layer 202 in the other of the pixels P1, P2, and P3 adjacent thereto. In particular, the source electrode S and the drain electrode D of the driving thin film transistor DT may be formed between one trench 205 and another trench 205 adjacent thereto in the boundary region between the plurality of pixels P1, P2, and P3. Throughout this specification, the boundary region between the plurality of pixels P1, P2, and P3 refers to a region overlapping a region in which a bank 231 of the light-emitting element layer 230 is formed.

The source electrode S and the drain electrode D may be made of an N-type semiconductor material doped with a pentavalent dopant having a polarity different from that of the base layer 201 in a partial region of the lower surface of the base layer 201. Therefore, the second substrate 200 may include the source electrode S and the drain electrode D of the driving thin film transistor DT. In addition, another region on the lower surface of the base layer 201 corresponding to a region between the source electrode S and the drain electrode D may function as a channel region of the driving thin film transistor DT.

The base layer 201 and the second doping layer 203 may be sequentially formed on upper surfaces of the source electrode S and the drain electrode D. The source/drain electrodes S/D, and the base layer 201 and the second doping layer 203 sequentially formed thereon are spaced apart from the first electrode E1 of the light-emitting element ED with the trench 205 interposed therebetween.

The second circuit layer 210 is formed on the lower surface of the second substrate 200 facing the first substrate 100.

A gate electrode G of the driving thin film transistor DT, a first connection line CL1 connecting the driving thin film transistor DT and the second pad layers 221, 222, and 223, and a second connection line CL2 connecting the driving thin film transistor DT and the first electrode E1 of the light-emitting element ED are formed in the second circuit layer 210.

Specifically, the second circuit layer 210 may include a first insulating layer 211 formed on the lower surface of the second substrate 200, the gate electrode G formed on a lower surface of the first insulating layer 211, a second insulating layer 212 formed on a lower surface of the gate electrode G, the first connection line CL1 and the second connection line CL2 formed on a lower surface of the second insulating layer 212, and a third insulating layer 213 formed on lower surfaces of the first connection line CL1 and the second connection line CL2.

The first insulating layer 211 may insulate between the gate electrode G and the source/drain electrodes S/D, the second insulating layer 212 may insulate between the gate electrode G and the first/second connection lines CL1 and CL2, and the third insulating layer 213 may function as a protective layer of the second circuit layer 210. Vias are formed in the first insulating layer 211, the second insulating layer 212, and the third insulating layer 213, respectively.

The drain electrode D of the driving thin film transistor DT may be electrically connected to the first connection line CL1 by the vias provided in the first insulating layer 211 and the second insulating layer 212, and the first connection line CL1 may be electrically connected to the second pad layers 221, 222, and 223 by the via provided in the third insulating layer 213, and accordingly, the drain electrode D of the driving thin film transistor DT may be electrically connected to the second pad layers 221, 222, and 223. In this case, the first connection line CL1 may function as the power supply line PL.

In addition, the source electrode S of the driving thin film transistor DT may be electrically connected to the second connection line CL2 by the vias provided in the first insulating layer 211 and the second insulating layer 212, and the second connection line CL2 may be electrically connected to the first electrode E1 of the light-emitting element ED, in particular, the second doping layer 203 by the via provided in the first insulating layer 211 and the second insulating layer 212, and accordingly, the source electrode S of the driving thin film transistor DT may be electrically connected to the first electrode E1 of the light-emitting element ED.

In some cases, the source electrode S of the driving thin film transistor DT may be electrically connected to the second pad layers 221, 222, and 223, and the drain electrode D of the driving thin film transistor DT may be electrically connected to the first electrode E1 of the light-emitting element ED.

The second pad layers 221, 222, and 223 are formed on a lower surface of the second circuit layer 210 facing the first substrate 100. The second pad layers 221, 222, and 223 include a second pad 221 provided in a first pixel P1, a second pad 222 provided in a second pixel P2, and a second pad 223 provided in a third pixel P3, and each of the second pads 221, 222, and 223 may be electrically connected to the drain electrode D of the driving thin film transistor DT through the first connection line CL1 that functions as the power supply line PL in the second circuit layer 210.

The second pad layers 221, 222 and 223 are electrically connected to the first pad layers 121, 122, and 123, respectively. In this case, the first pad layers 121, 122, and 123 are connected to a power supply circuit of the first circuit layer 110, and accordingly, the power generated by the power supply circuit of the first circuit layer 110 may be supplied to the drain electrode D of the driving thin film transistor DT through the first pad layers 121, 122, and 123, the second pad layers 221, 222, and 223, the plurality of vias, and the first connection line CL1.

The light-emitting element layer 230 is formed on an upper surface of the second substrate 200 that does not face the first substrate 100.

The light-emitting element layer 230 includes a bank 231, a light-emitting layer 232, and a second electrode 233.

The bank 231 is formed on the upper surface of the second substrate 200 and, specifically, is formed on an upper surface of the second doping layer 203 provided in a boundary region between the pixels P1, P2, and P3. The bank 231 is formed in a mesh shape in a planar structure to define a light-emitting region for each of the pixels P1, P2, and P3. Therefore, the bank 231 is formed in the boundary region between the pixels P1, P2, and P3, and light emission may occur in a region in which the bank 231 is not formed. The bank 231 may be formed of an inorganic insulating material or an organic insulating material. The bank 231 may be formed in a multi-layer structure, for example, in a two-layer structure consisting of a lower layer made of an inorganic insulating material and an upper layer made of an organic insulating material. The bank 231 may be formed so as to overlap the trench 205 so that the light-emitting layer 232 does not come into contact with the trench 205.

The light-emitting layer 232 is provided on the first electrode E1 in the second substrate 200. In particular, the light-emitting layer 232 is formed on the upper surface of the second doping layer 203 in the pixels P1, P2, and P3. The light-emitting layer 232 may include a red (R) light-emitting layer, a green (G) light-emitting layer, and a blue (B) light-emitting layer patterned for each of the pixels P1, P2, and P3. However, the present disclosure is not necessarily limited thereto, and the light-emitting layer 232 may be provided so as to emit white light by including a plurality of stack structures that emit light of different colors. When the light-emitting layer 232 includes the plurality of stack structures, the light-emitting layer may not be patterned for each of the pixels P1, P2, and P3 but may be formed entirely on the upper surface of the second substrate 200, and in this case, a separate color filter may be provided on the second electrode 233 for each of the pixels P1, P2, and P3.

The second electrode 233 is formed on the light-emitting layer 232 and, in particular, is not patterned for each of the pixels P1, P2, and P3 and is formed entirely on the upper surface of the second substrate 200. The light-emitting display device according to an embodiment of the present disclosure is made in a so-called top emission method in which light emitted from the light-emitting layer 232 is emitted upward, and the second electrode 233 may be made of a transparent electrode through which the light emitted from the light-emitting layer 232 may be transmitted.

Figure 5:
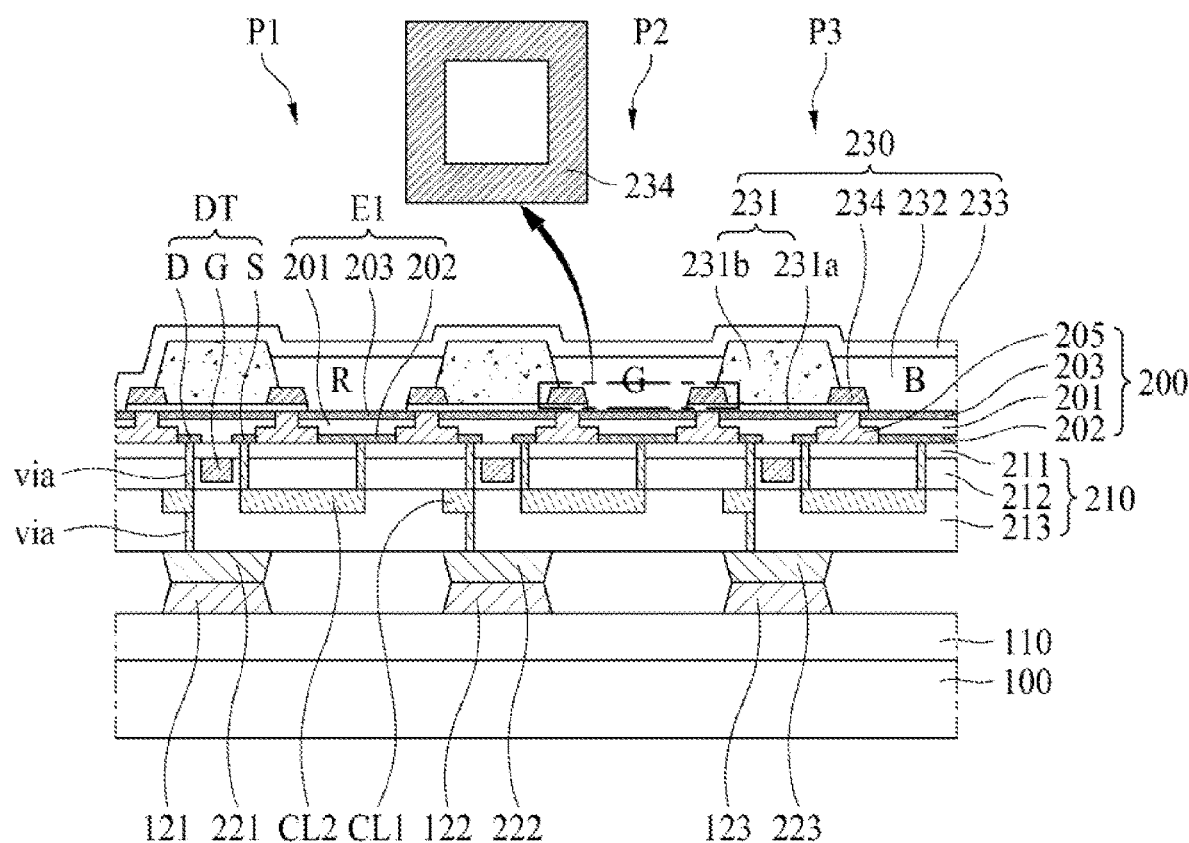
FIG. 5 is a cross-sectional view of a light-emitting display device according to still another embodiment of the present disclosure.

FIG. 5 is a cross-sectional view of a light-emitting display device according to still another embodiment of the present disclosure. The light-emitting display device according to FIG. 5 is different from the light-emitting display device according to FIG. 4 described above in that a reflective layer 234 is additionally provided in a light-emitting element layer 230. Therefore, the same reference numerals are assigned to the same configurations, and only different configurations will be described below.

As can be seen in FIG. 5, the light-emitting element layer 230 includes a bank 231, a light-emitting layer 232, a second electrode 233, and a reflective layer 234.

The bank 231 includes a first bank layer 231a and a second bank layer 231b provided on the first bank layer 231a. A thickness of the first bank layer 231a may be smaller than that of the second bank layer 231b, and a width of the first bank layer 231a may be larger than that of the second bank layer 231b. The first bank layer 231a may be made of an inorganic insulating material, and the second bank layer 231b may be made of an organic insulating material.

The reflective layer 234 may be formed between the first bank layer 231a and the second bank layer 231b. More specifically, the reflective layer 234 is formed on an edge region of the first bank layer 231a, and the second bank layer 231b is formed on a partial region of the reflective layer 234. As can be seen from the drawing drawn by an arrow in FIG. 5, the reflective layer 234 may have a quadrangular frame structure in which a central region is empty and a light-emitting region is provided in the central region. A region of the reflective layer 234 not covered by the second bank layer 231b is in contact with the light-emitting layer 232. The reflective layer 234 may be made of a metal material having excellent reflectivity such as silver (Ag), and thus, light emitted from the light-emitting layer 232 may be reflected from the reflective layer 234.

Since the light-emitting display device according to another embodiment of the present disclosure separately includes a first electrode E1 and the reflective layer 234 under the light-emitting layer 232, a semiconductor material having a high work function may be used as a material of the first electrode E1, and a material having high reflectivity may be used as a material of the reflective layer 234 so that luminous efficiency may be improved.

In general, when a material having high reflectivity is used as a material of the first electrode E1 provided under the light-emitting layer 232, luminous efficiency may be improved. However, it is preferable to basically use a material having a high work function as the first electrode E1, but a material having high reflectivity among materials having a high work function is not common. Therefore, in another embodiment of the present disclosure, a semiconductor material having a high work function is used as the material of the first electrode E1, and instead, a separate reflective layer 234 is formed of a material having high reflectivity, thereby maximizing luminous efficiency.

The light-emitting layer 232 is in contact with each of the first electrode E1, the first bank layer 231a, the reflective layer 234, and the second bank layer 231b. Light is emitted from a portion of the light-emitting layer 232 in contact with the first electrode E1, and the emitted light is reflected by the reflective layer 234 and is emitted upward.

The second electrode 233 is formed on upper surfaces of the light-emitting layer 232 and the second bank layer 231b.

FIGS. 6A to 6G are cross-sectional views illustrating a manufacturing process of a light-emitting display device according to an embodiment of the present disclosure that relate to a manufacturing process according to an embodiment of the light-emitting display device of FIG. 5 described above. Hereinafter, the same reference numerals are assigned to the same configuration, and repeated description in relation to a structure having the same configuration and the like will be omitted.

Figure 6A:
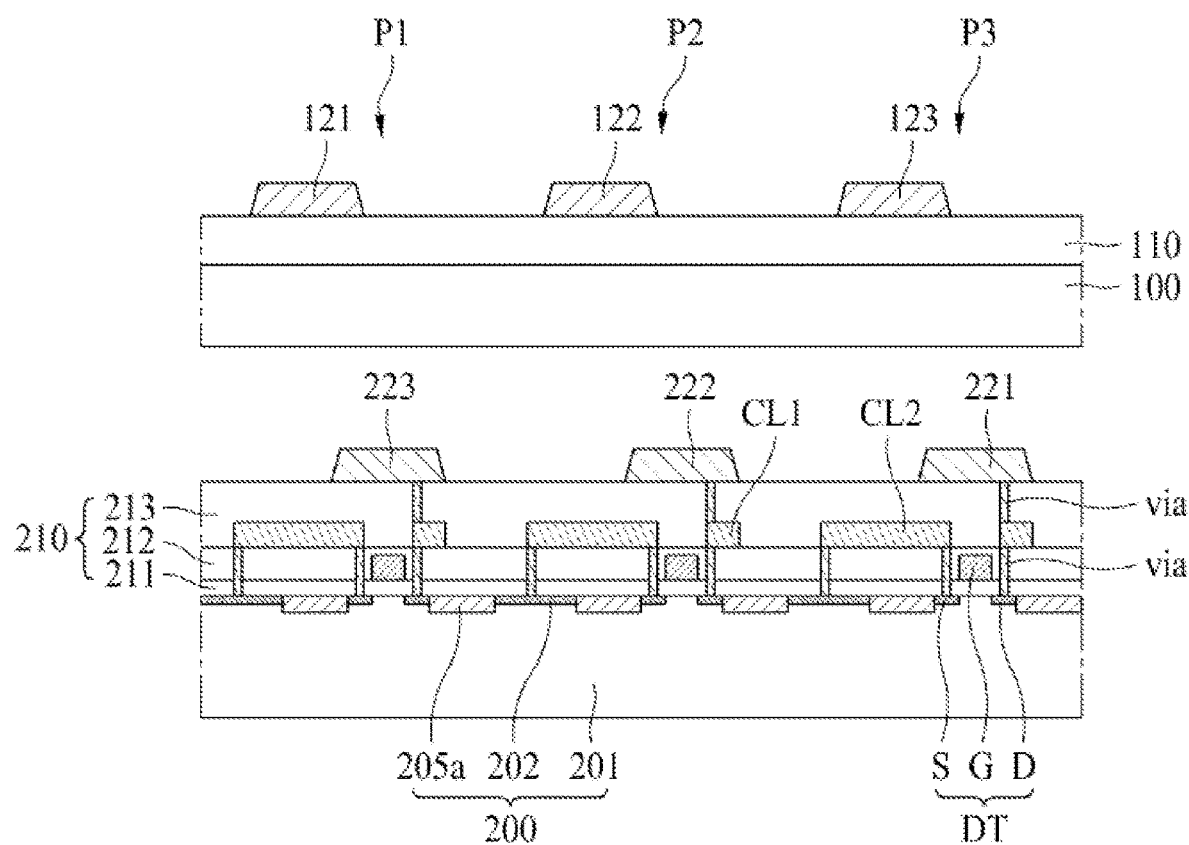
FIGS. 6A, 6B, 6C, 6D, 6E, 6F and 6G are cross-sectional views illustrating a manufacturing process of a light-emitting display device according to an embodiment of the present disclosure.

First, as can be seen in FIG. 6A, a first circuit layer 110 is formed on one surface of a first substrate 100, and first pad layers 121, 122, and 123 are formed on one surface of the first circuit layer 110. In addition, a second circuit layer 210 is formed on one surface of a second substrate 200, and second pad layers 221, 222, and 223 are formed on one surface of the second circuit layer 210.

In particular, a first doping layer 202 is formed by doping a dopant having the same polarity as a base layer 201 on one surface of the base layer 201 of the second substrate 200, and a source electrode S and a drain electrode D are formed by doping a dopant having a polarity different from that of the base layer 201 on one surface of the base layer 201. In this case, the first doping layer 202 is formed in pixels P1, P2, and P3, and the source/drain electrodes S/D are formed in the boundary region between the pixels P1, P2, and P3. In addition, a first trench 205a is formed between the source/drain electrode S/D and the first doping layer 202, and an insulating material is filled in a first trench 205a.

Figure 6B:
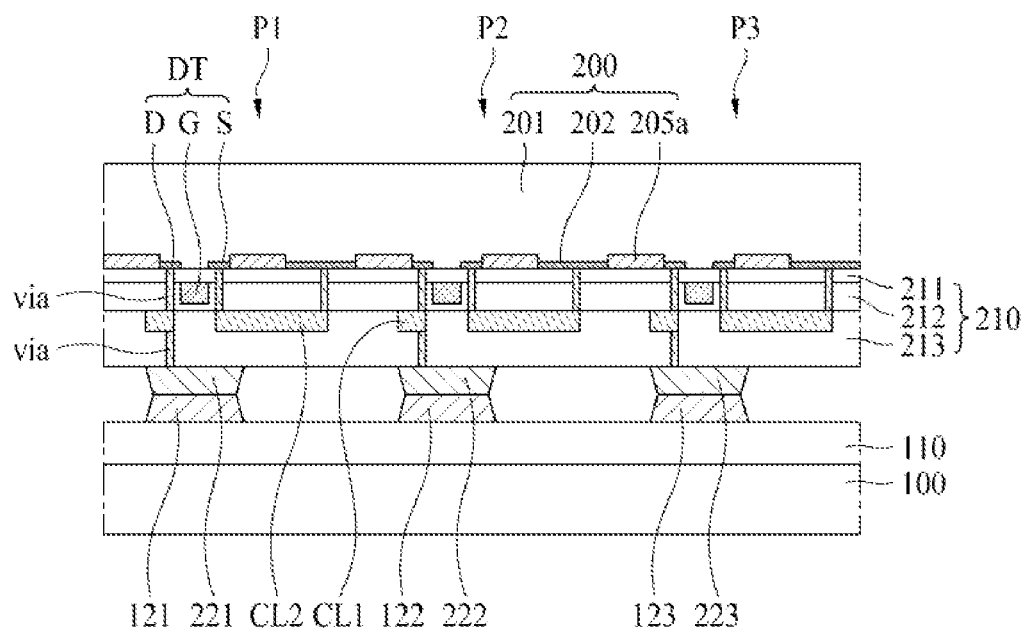

Next, as can be seen in FIG. 6B, the first pad layers 121, 122, and 123, and the second pad layers 221, 222, and 223 are aligned so as to face each other by placing the second substrate 200 upside down on the first substrate 100, and then the first pad layers 121, 122, and 123 and the second pad layers 221, 222, and 223 are electrically connected.

Figure 6C:
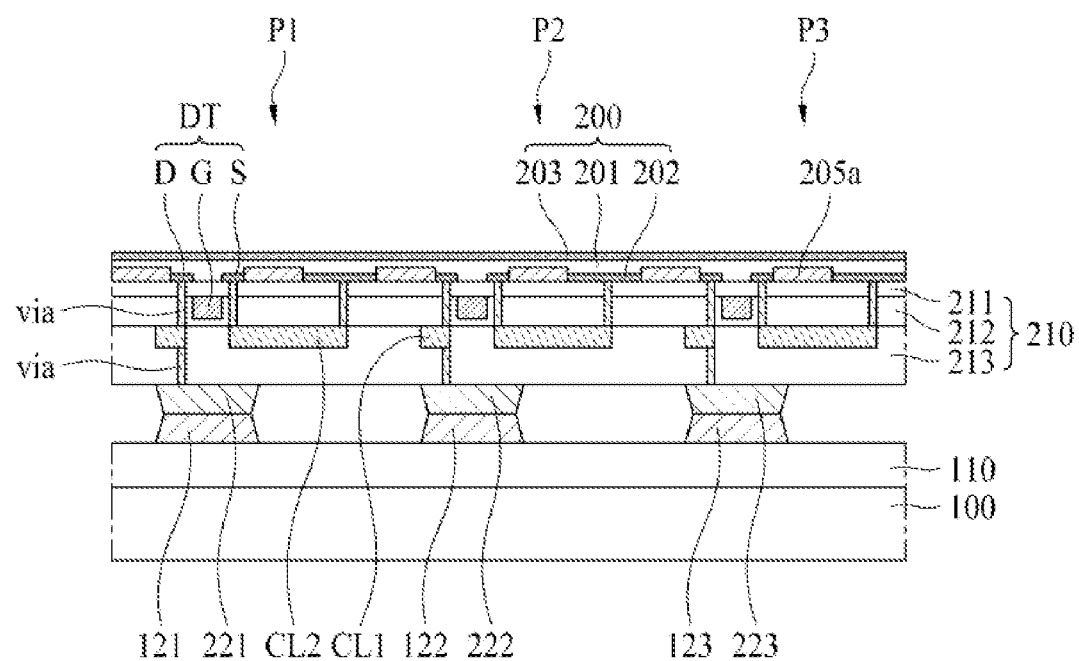

Next, as can be seen in FIG. 6C, a thickness of the second substrate 200, specifically, a thickness of the base layer 201 is reduced by grinding the other surface of the second substrate 200. Thereafter, a second doping layer 203 is formed by doping a dopant having the same polarity as that of the base layer 201 on the other surface of the second substrate 200, specifically the other surface of the base layer 201. When the thickness of the base layer 201 is too large, a resistance of a first electrode E1 of a light-emitting element may be too large, and thus the thickness of the base layer 201 is reduced to reduce the resistance of the first electrode E1.

Figure 6D:
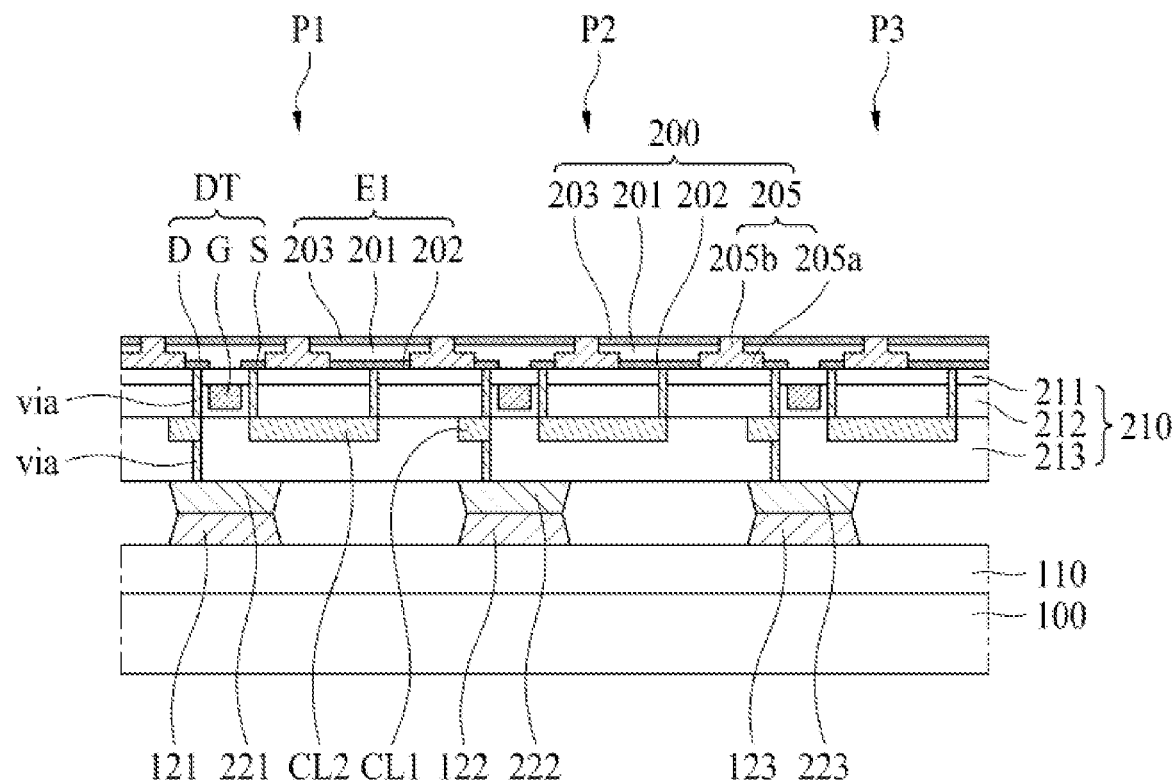

Next, as can be seen in FIG. 6D, a second trench 205b is formed in a region overlapping the first trench 205a, and an insulating material is filled in the second trench 205b. Accordingly, the first electrode E1 composed of a combination of the base layer 201, the first doping layer 202, and the second doping layers 203 is formed while being separated for each of the pixels P1, P2, and P3 by a trench 205 composed of the first trench 205a and the second trench 205b.

Figure 6E:
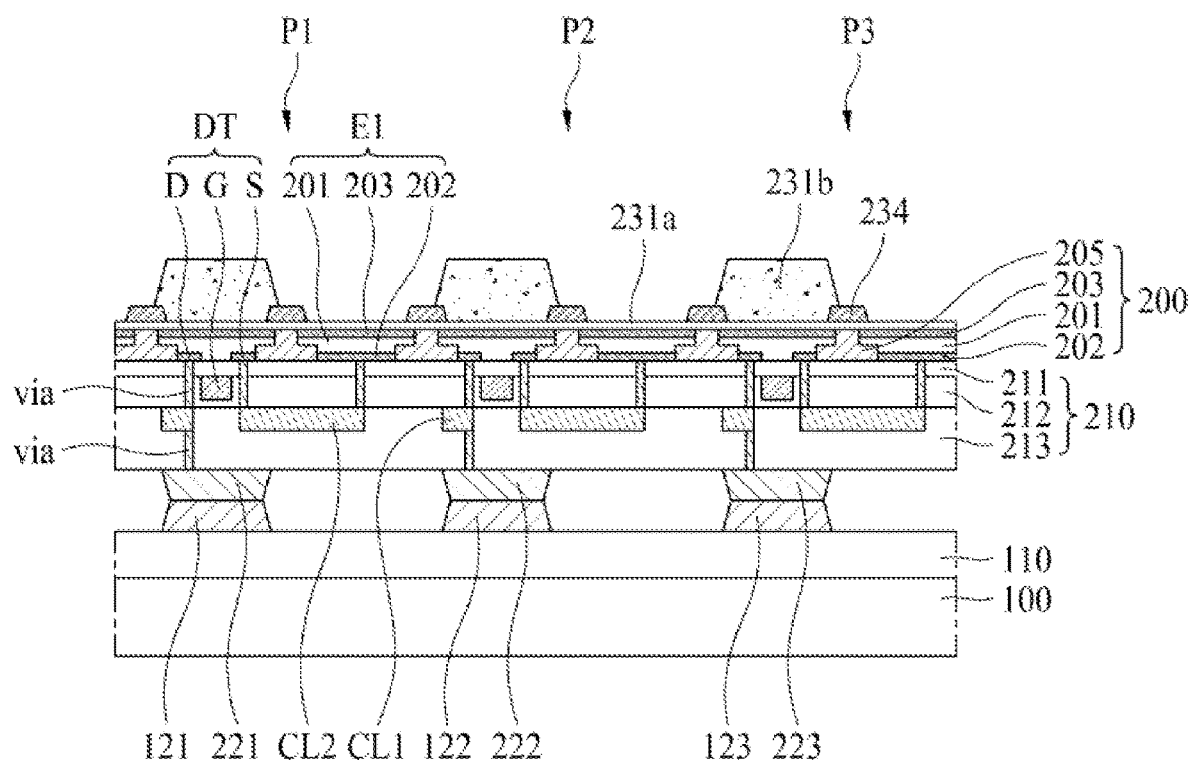

Next, as can be seen in FIG. 6E, a first bank layer 231a is formed on the other surface of the second substrate 200, specifically on the second doping layer 203 and the second trench 205b, a reflective layer 234 is patterned on the first bank layer 231a, and a second bank layer 231b is patterned on the reflective layer 234.

Figure 6F:
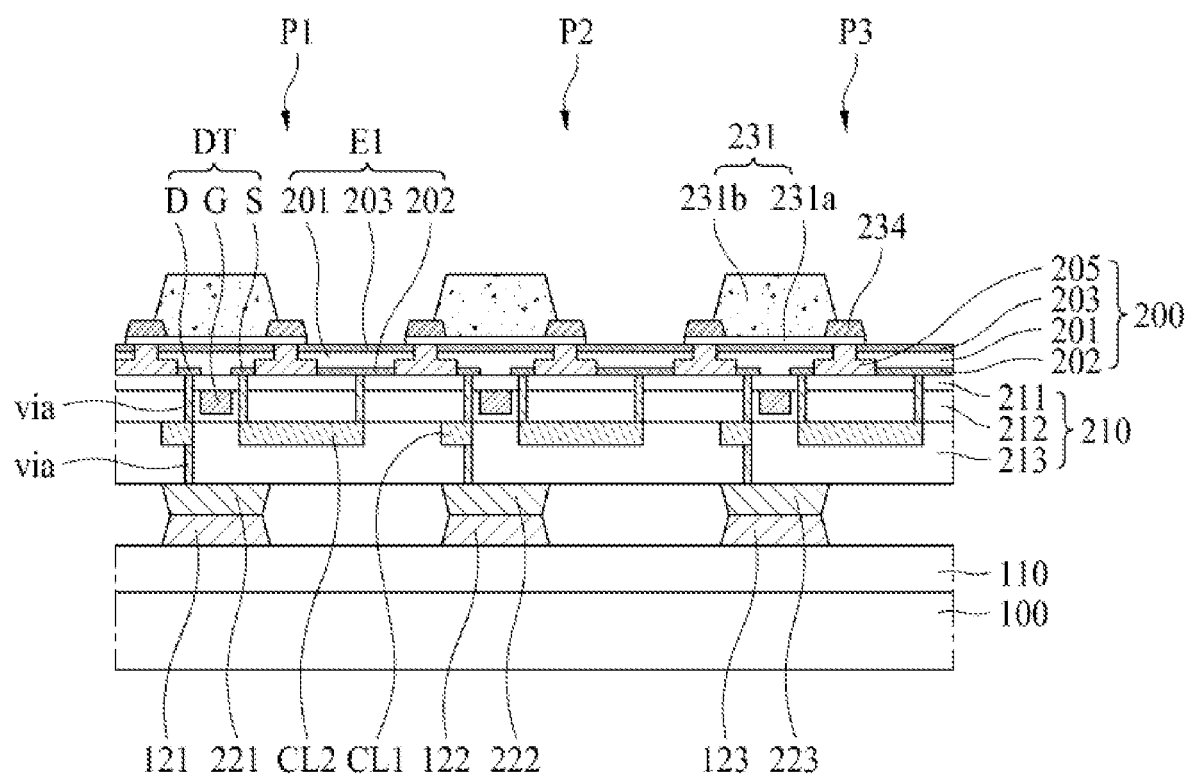

Next, as can be seen in FIG. 6F, the first bank layer 231a in regions of the pixels P1, P2, and P3 is removed to expose the first electrode E1 that is composed of the base layer 201, the first doping layer 202, and the second doping layer 203 thereunder.

Figure 6G:
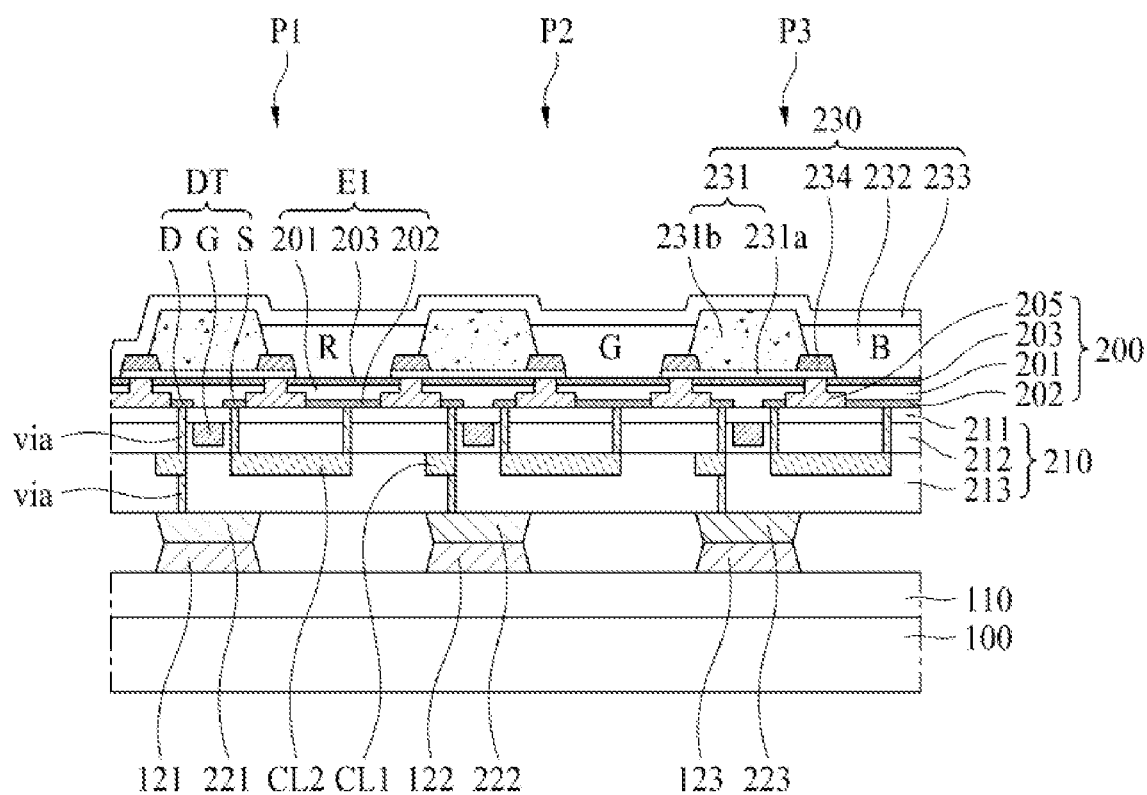

Next, as can be seen in FIG. 6G, a light-emitting layer 232 is formed on the first electrode E1 and the reflective layer 234, and a second electrode 233 is formed on the light-emitting layer 232.

FIGS. 7A to 7F are cross-sectional views illustrating a manufacturing process of a light-emitting display device according to another embodiment of the present disclosure that relate to a manufacturing process according to another embodiment of the light-emitting display device of FIG. 5 described above. Hereinafter, the same reference numerals are assigned to the same configuration, and repeated description in relation to a structure having the same configuration and the like will be omitted.

Figure 7A:
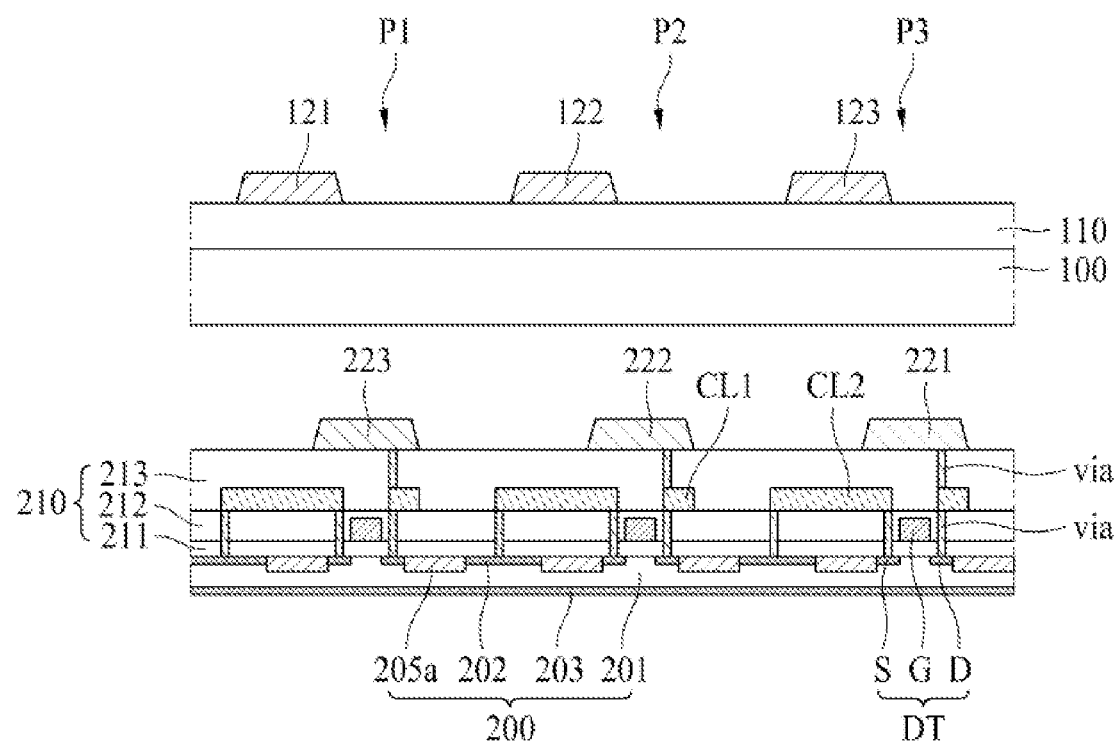
FIGS. 7A, 7B, 7C, 7D, 7E and 7F are cross-sectional views illustrating a manufacturing process of a light-emitting display device according to another embodiment of the present disclosure.

First, as can be seen in FIG. 7A, a first circuit layer 110 is formed on one surface of a first substrate 100, and first pad layers 121, 122, and 123 are formed on one surface of the first circuit layer 110. In addition, a second circuit layer 210 is formed on one surface of a second substrate 200, and second pad layers 221, 222, and 223 are formed on one surface of the second circuit layer 210.

In particular, as in the above-described embodiment, a first doping layer 202 is formed by doping a dopant having the same polarity as a base layer 201 on one surface of the base layer 201 of the second substrate 200, a source electrode S and a drain electrode D are formed by doping a dopant having a polarity different from that of the base layer 201 on one surface of the base layer 201, a first trench 205a is formed between the source/drain electrodes S/D and the first doping layer 202, and an insulating material is filled in the first trench 205a.

In addition, the other surface of the base layer 201 is grinded, and then a second doping layer 203 is formed by doping a dopant having the same polarity as the base layer 201 on the entire other surface of the base layer 201.

As described above, another embodiment of the present disclosure according to FIGS. 7A to 7F differs from the above-described embodiment according to FIGS. 6A to 6G in that the other surface of the base layer 201 is ground and the second doping layer 203 is formed on the other surface of the base layer 201 before a process of electrically connecting the first pad layers 121, 122, and 123 and the second pad layers 221, 222, and 223.

Figure 7B:
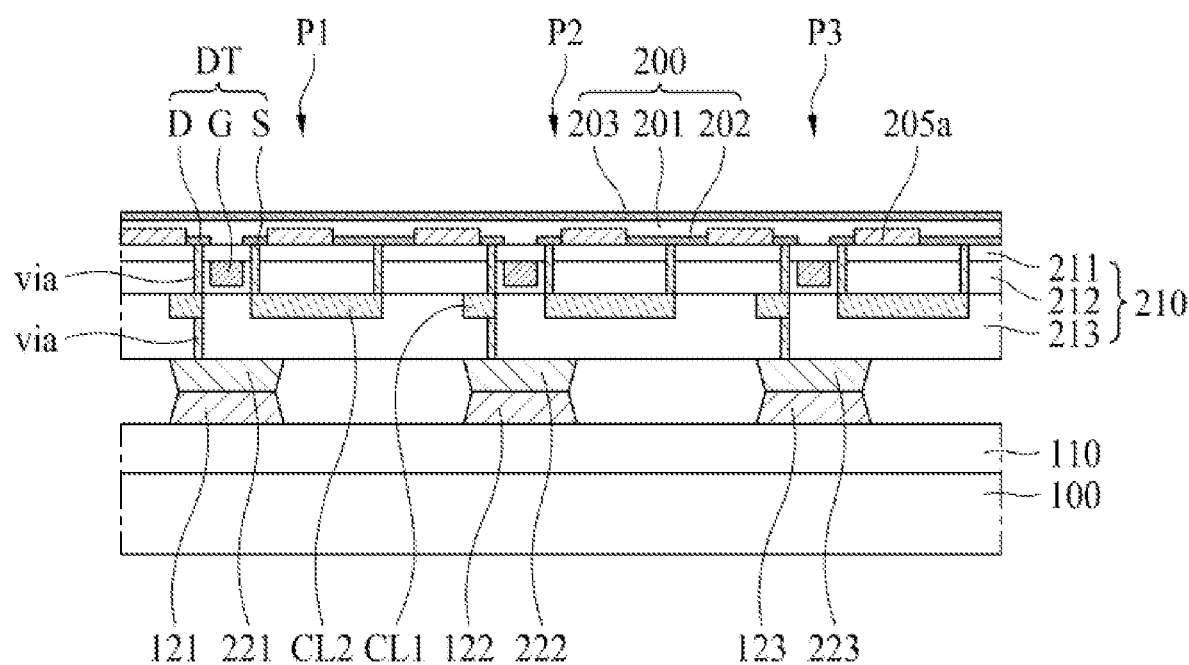

Next, as can be seen in FIG. 7B, the first pad layers 121, 122, and 123, and the second pad layers 221, 222, and 223 are aligned so as to face each other by placing the second substrate 200 upside down on the first substrate 100, and then the first pad layers 121, 122, and 123 and the second pad layers 221, 222, and 223 are electrically connected.

Figure 7C:
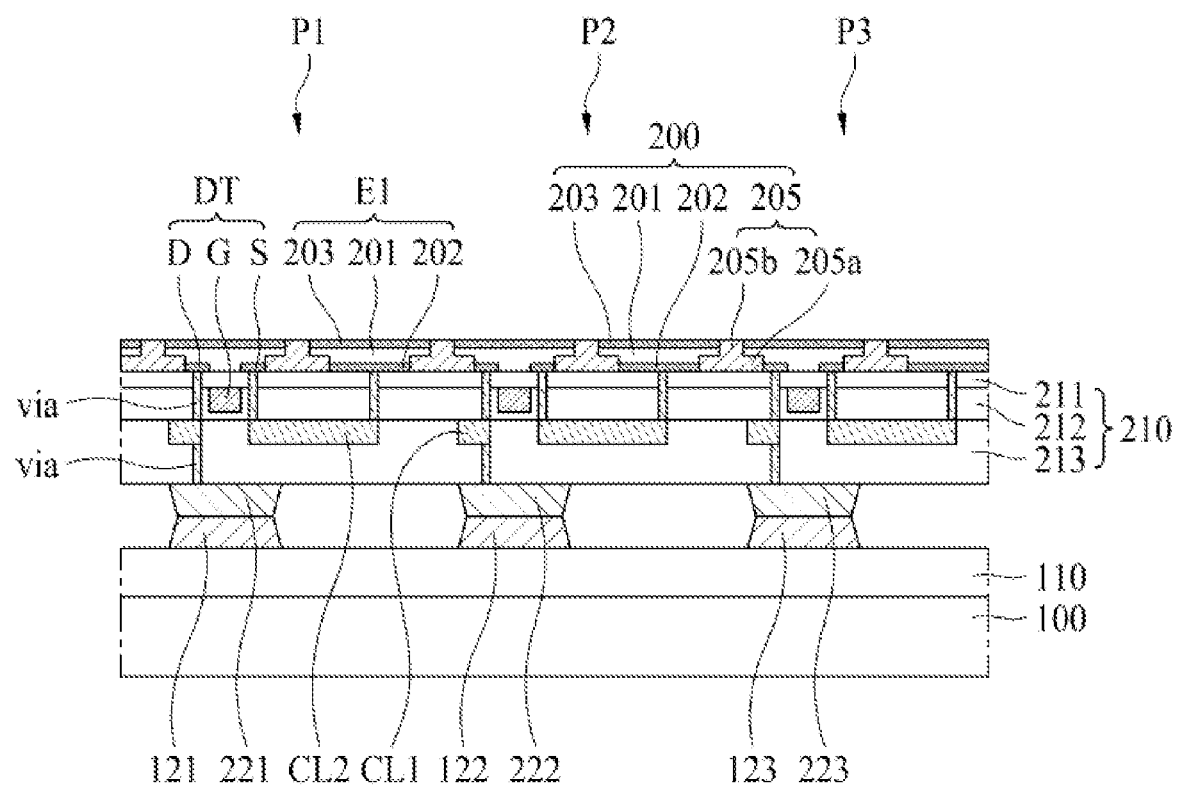

Next, as can be seen in FIG. 7C, a second trench 205b is formed in a region overlapping the first trench 205a, and an insulating material is filled in the second trench 205b. Accordingly, a first electrode E1 composed of a combination of the base layer 201, the first doping layer 202, and the second doping layers 203 is formed while being separated for each of the pixels P1, P2, and P3 by a trench 205 composed of the first trench 205a and the second trench 205b. In some cases, the process of forming the second trench 205b of FIG. 7C and filling with the insulating material may also be performed together in the process of FIG. 7A.

Figure 7D:
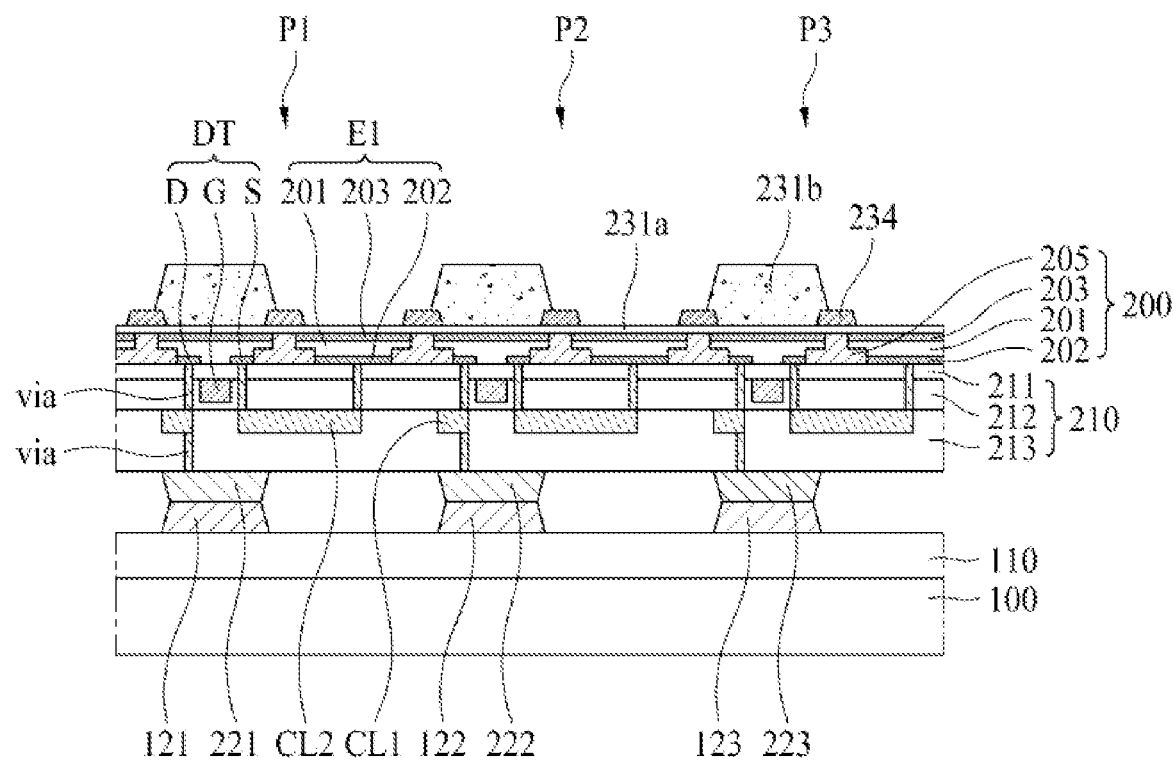

Next, as can be seen in FIG. 7D, a first bank layer 231a is formed on the other surface of the second substrate 200, specifically on the second doping layer 203 and the second trench 205b, a reflective layer 234 is patterned on the first bank layer 231a, and a second bank layer 231b is patterned on the reflective layer 234.

Figure 7E:
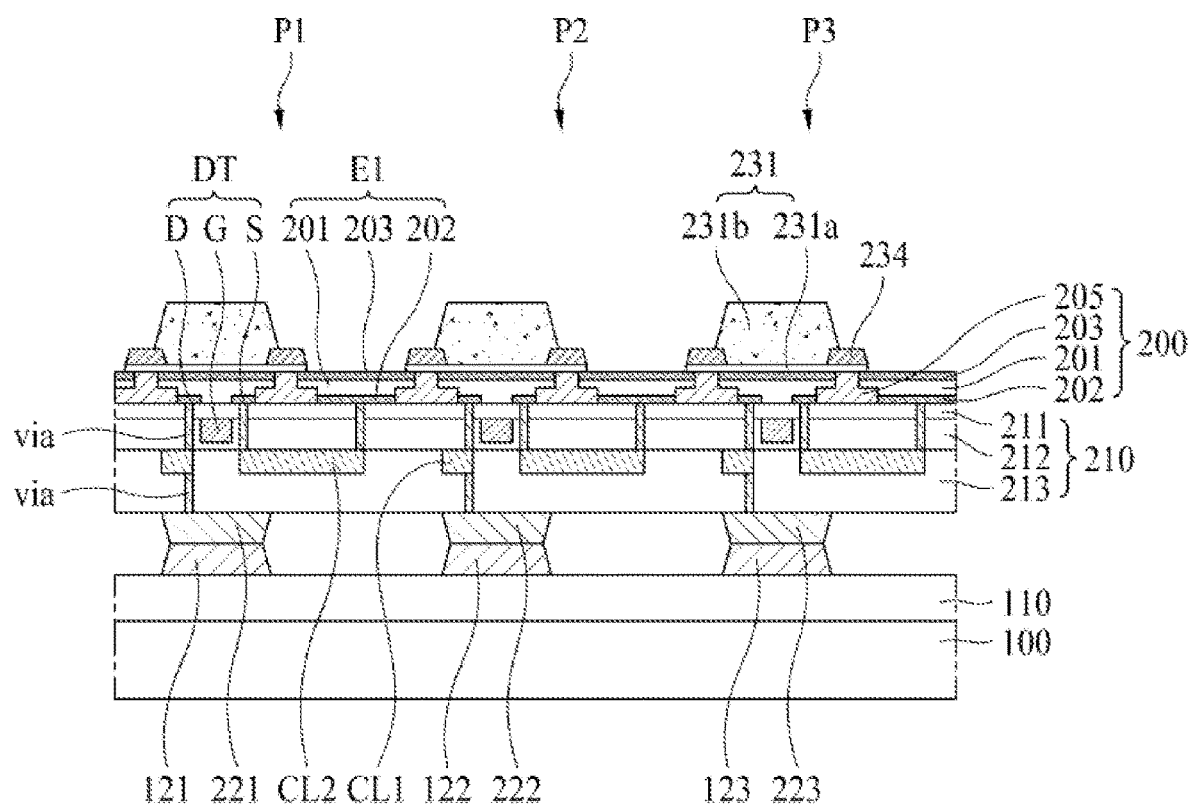

Next, as can be seen in FIG. 7E, the first bank layer 231a in regions of the pixels P1, P2, and P3 is removed to expose the first electrode E1 that is composed of the base layer 201, the first doping layer 202, and the second doping layer 203 thereunder.

Figure 7F:
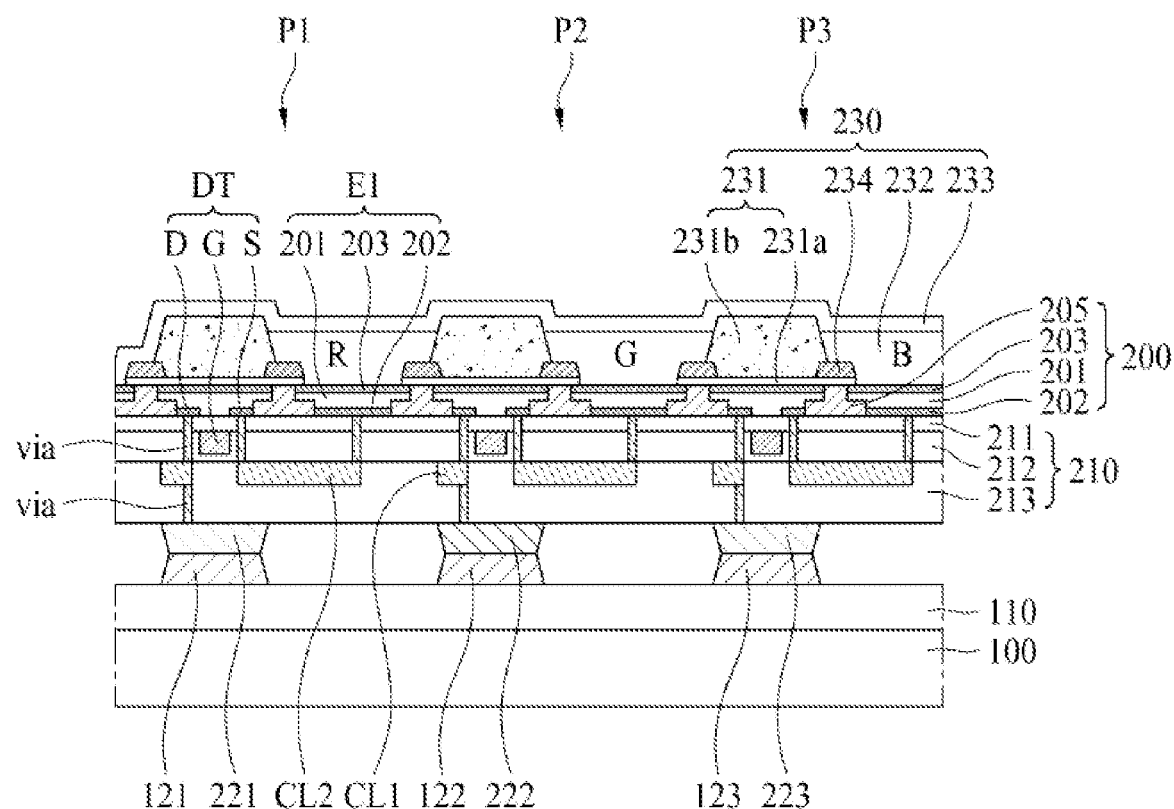

Next, as can be seen in FIG. 7F, a light-emitting layer 232 is formed on the first electrode E1 and the reflective layer 234, and a second electrode 233 is formed on the light-emitting layer 232.

According to an embodiment of the present disclosure, a first circuit layer having a driving unit is formed on one surface of a first substrate, a second circuit layer having a pixel circuit is formed on one surface of a second substrate facing the first substrate, and a light-emitting element layer is formed on the other surface of the second substrate that does not face the first substrate, so that a light-emitting region of the light-emitting element layer can be enlarged.

According to an embodiment of the present disclosure, since a first electrode of a light-emitting element can be formed through a combination of a base layer, a first doping layer, and a second doping layer constituting a second substrate, the first electrode can be formed of a semiconductor material having a high work function and doped with a high concentration, and thus luminous efficiency can be improved.

According to another embodiment of the present disclosure, since a first electrode and a reflective layer are separately provided under a light-emitting layer, a semiconductor material having a high work function can be used as a material of the first electrode, and a material having high reflectivity can be used as a material of the reflective layer, and thus luminous efficiency can be improved.

The embodiments of the present disclosure have been described in more detail with reference to the accompanying drawings, but the present disclosure is not necessarily limited to these embodiments and may be variously modified without departing from the technological spirit of the present disclosure. Therefore, the embodiments disclosed in the present disclosure are not intended to limit the technological spirit of the present disclosure, and the embodiments are intended to describe, and the scope of the technological spirit of the present disclosure is not limited by such embodiments. Therefore, it should be understood that the embodiments described above are illustrative in all respects and not restrictive. The protection scope of the present disclosure should be construed by the claims, and all technological spirits within the equivalent scope thereof should be construed as being included in the scope of rights of the present disclosure.

What is claimed is:

1. A light-emitting display device comprising:
a first substrate and a second substrate;
a first circuit layer provided on one surface of the first substrate;
a second circuit layer provided on one surface of the second substrate facing the first substrate;
a first pad layer provided on one surface of the first circuit layer;
a second pad layer provided on one surface of the second circuit layer and electrically connected to the first pad layer; and
a light-emitting element layer provided on another surface of the second substrate that is not provided with the second circuit layer and does not face the first substrate, wherein
at least one of a gate driving circuit, a data driving circuit, and a power supply circuit is provided in the first circuit layer,
at least one of a gate line, a data line, a power supply line, a part of a thin film transistor, and a capacitor is provided in the second circuit layer,
the part of the thin film transistor provided in the second circuit layer is disposed between the light-emitting element layer and the second pad layer, and
a distance between a drain electrode of the thin film transistor and the light-emitting element layer is smaller than a distance between a gate electrode of the thin film transistor and the light-emitting element layer,
wherein a first electrode of a light-emitting element is provided for each pixel inside the second substrate, and a light-emitting layer and a second electrode of the light-emitting element are provided in the light-emitting element layer,
wherein the first electrode includes a base layer made of a first semiconductor material, a first doping layer provided on one surface of the base layer, and a second doping layer provided on the other surface of the base layer,
wherein adjacent two first electrodes are spaced apart by a trench provided inside the second substrate therebetween, and
wherein the drain electrode includes a second semiconductor material having a polarity different from the first semiconductor material of the base layer of the first electrode.

2. The light-emitting display device of claim 1, wherein the first pad layer is connected to the gate driving circuit of the first circuit layer and the second pad layer is connected to the gate line of the second circuit layer, the first pad layer is connected to the data driving circuit of the first circuit layer and the second pad layer is connected to the data line of the second circuit layer, or the first pad layer is connected to the power supply circuit of the first circuit layer and the second pad layer is connected to the power supply line of the second circuit layer.

3. The light-emitting display device of claim 1, wherein the light-emitting element layer is electrically connected to the second circuit layer through the second substrate.

4. The light-emitting display device of claim 1, wherein one of a source electrode and the drain electrode is electrically connected to the second pad layer through a first connection line provided in the second circuit layer, and another one of the source electrode and the drain electrode is electrically connected to the first electrode through a second connection line provided in the second circuit layer.

5. The light-emitting display device of claim 1, wherein the second substrate further comprises a base layer made of a semiconductor material on a source electrode and the drain electrode and a doping layer provided on the base layer, and the base layer and the doping layer are spaced apart from the first electrode by a trench provided inside the second substrate therebetween.

6. The light-emitting display device of claim 1, wherein the light-emitting element layer further includes a first bank layer, a second bank layer, and a reflective layer provided between the first and second bank layers, and the light-emitting layer is provided to come into contact with the first electrode and the reflective layer.

7. The light-emitting display device of claim 6, wherein the reflective layer has a quadrangular frame structure in which a central region is empty, and the central region constitutes a light-emitting region.

8. A method of manufacturing a light-emitting display device, the method comprising:

forming a first circuit layer on one surface of a first substrate and forming a first pad layer on one surface of the first circuit layer;

forming a second circuit layer on one surface of a second substrate and forming a second pad layer on one surface of the second circuit layer;

aligning the first substrate and the second substrate so that the first pad layer and the second pad layer face each other and then electrically connecting the first pad layer and the second pad layer; and forming a light-emitting element layer on the other surface of the second substrate that does not face the first substrate.

9. The method of claim 8, further comprising forming a first electrode of a light-emitting element inside the second substrate, wherein the forming of the light-emitting element layer includes forming a light-emitting layer on the first electrode and forming a second electrode on the light-emitting layer.

10. The method of claim 9, wherein the forming of the first electrode includes forming a first doping layer on one surface of a base layer made of a semiconductor material, forming a second doping layer on the other surface of the base layer, and forming a trench in the second substrate.

11. The method of claim 10, wherein the forming of the first doping layer is performed before the electrically connecting of the first pad layer and the second pad layer, and the forming of the second doping layer is performed after the electrically connecting of the first pad layer and the second pad layer.

12. The method of claim 10, wherein the forming of the first doping layer and the forming of the second doping layer are performed before the electrically connecting of the first pad layer and the second pad layer.

13. The method of claim 11, wherein the forming of the trench includes forming a first trench before the electrically connecting of the first pad layer and the second pad layer and forming a second trench after the electrically connecting of the first pad layer and the second pad layer.

14. The method of claim 12, wherein the forming of the trench includes forming a first trench before the electrically connecting of the first pad layer and the second pad layer and forming a second trench after the electrically connecting of the first pad layer and the second pad layer.

15. The method of claim 9, wherein the forming of the light-emitting element layer further includes forming a first bank layer on the other surface of the second substrate, patterning a reflective layer on the first bank layer, patterning a second bank layer on the reflective layer, and removing a predetermined portion of the first bank layer such that the first electrode is exposed.

16. The light-emitting display device of claim 1, wherein the light-emitting element layer comprises a first light-emitting element configured to emit light of a first color and a second light-emitting element configured to emit light of a second color, a first trench for separating an electrode of the first light-emitting element from a source and a drain of a first transistor is provided in the second substrate and on the second circuit layer, a second trench for separating an electrode of the second light-emitting element from the source and the drain of the first transistor is provided in the second substrate and on the second circuit layer, and the source and the drain of the first transistor are provided in the second substrate and on the second circuit layer.

* * * * *